(12) United States Patent
Haupt et al.

(10) Patent No.: US 6,552,911 B1
(45) Date of Patent: Apr. 22, 2003

(54) ELECTRICAL DEVICE

(75) Inventors: Martin Haupt, Cowbridge (GB);
Frank Mayer, Ludwigsburg (DE);
Jochen Schweinbenz, Stuttgart (DE);
Peter Schiefer, Untergruppenbach
(DE); Ralf Schinzel, Marbach am
Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/743,486

(22) PCT Filed: May 10, 2000

(86) PCT No.: PCT/DE00/01463

§ 371 (c)(1),
(2), (4) Date: Mar. 1, 2001

(87) PCT Pub. No.: WO00/70922

PCT Pub. Date: Nov. 23, 2000

(30) Foreign Application Priority Data

May 12, 1999 (DE) .......................... 199 21 928

(51) Int. Cl.[7] .............................. H05K 5/02; H05K 7/00
(52) U.S. Cl. ...................... 361/752; 174/50; 174/50.52
(58) Field of Search .............................. 361/752, 759, 361/740, 796, 801, 802, 736; 439/607–610, 377; 174/50, 50.52

(56) References Cited

U.S. PATENT DOCUMENTS

| | | | | |
|---|---|---|---|---|
| 4,833,295 A | | 5/1989 | Locker et al. | |
| 4,995,834 A | * | 2/1991 | Hasegawa | 439/620 |
| 5,213,522 A | * | 5/1993 | Kojima | 439/620 |
| 5,473,509 A | * | 12/1995 | Shoettl et al. | 361/715 |
| 5,506,373 A | * | 4/1996 | Hoffman | 174/35 GC |
| 5,671,122 A | * | 9/1997 | Shoettl et al. | 361/715 |
| 5,703,754 A | * | 12/1997 | Hinze | 361/736 |
| 6,034,876 A | * | 3/2000 | Ohno et al. | 361/752 |
| 6,123,565 A | * | 9/2000 | Bierek et al. | 439/377 |
| 6,407,925 B1 | * | 6/2002 | Kobayashi | 361/752 |

FOREIGN PATENT DOCUMENTS

| | | |
|---|---|---|
| DE | 36 00 532 A1 | 10/1986 |
| DE | 39 37 190 A1 | 5/1991 |
| DE | 42 32 048 A1 | 3/1994 |
| DE | 93 18 985 U | 4/1995 |
| DE | 196 25 757 A1 | 1/1998 |
| DE | 197 55 497 C1 | 7/1999 |

* cited by examiner

*Primary Examiner*—David Martin
*Assistant Examiner*—Dameon E. Kevi
(74) *Attorney, Agent, or Firm*—Michael J. Striker

(57) ABSTRACT

An electrical device is proposed which has a housing (1), comprising at least two housing parts (2, 3), and an electronic circuit disposed in the housing (1). A connection device (5) for supplying voltage to the device and/or for signal transmission to the electronic circuit is present that can be secured to the housing (1); the housing parts (2, 3) are joined to one another by laser welding at a joining edge (4). The connection device (5) is provided with a welding flange (8), which comes to rest between the housing parts (2, 3) in such a way that an at least nonpositive connection of the housing parts (2, 3), with enclosure of the connection device (5), can be produced.

8 Claims, 1 Drawing Sheet

ELECTRICAL DEVICE

PRIOR ART

The invention relates to an electrical device, in particular an electronic control or regulating unit for an electromechanical apparatus, as generically defined by the preamble to the main claim.

From German Published, Unexamined Patent Disclosure DE- OS 39 37 190, an electrical device is already known in which the control unit electronics for components of an internal combustion engine is disposed in a housing that is mounted in the region of the engine devices. The two-part metal housing can be closed in an electromagnetically shielded way; a connection device for connecting lines is integrated into the housing and by way of it, both the voltage supply and the transmission of measurement and control signals are possible.

From German Patent Disclosure DE 196 25 757.3 A1, it is also known to embody the connection device with plug contacts in a plastic power strip; the plastic power strip is an injection-molded part and is integrated with further housing parts in the injection molding process.

In the production of such housings for an electrical device, especially for controlling electromechanical apparatuses, for instance in the motor vehicle, care must be taken that both a tight connection of the housing parts and good electromagnetic shielding (EMV) for the control unit electronics be attainable at the least possible production effort and expense.

ADVANTAGES OF THE INVENTION

The electrical device described at the outset, having a housing comprising at least two housing parts and having an electronic circuit that can be disposed in the housing, and having a connection device, capable of being secured to the housing, for supplying voltage to the device and/or for signal transmission to the electronic circuit is further refined according to the invention with the characteristics of the body of claim 1. The device is especially advantageous because the housing parts are tightly joined together by laser welding at a joining edge, the result of which is good mechanical and dynamic strength of the housing. The housing is furthermore extensively protected against unauthorized manipulation, since it cannot be dismantled with being damaged.

With the invention, a novel mounting and sealing concept, for instance for electronic control units, can be achieved in an advantageous way; with it, sealing problems between the joining partners, made of different materials, can be solved with the goal of producing a tight materially bonded connection. The performance of the control unit can thus be enhanced as a result of the increased mechanical and dynamic strength, and as a result of an improved EMV performance in the closed housing unit.

The thermal performance of the device of the invention can also be improved at thermally critical points by the uniform clamping connection, since screwing is unnecessary, and large-area heat dissipation is thus assured.

Laser welding, known per se, is suitable for various combinations of material, such as cast aluminum and sheet aluminum; high energy at the welding point can be attained with relatively little heat production at the workpiece to be welded. Laser welding combines the two work operations that otherwise proceed separately, that is, applying a seal and ensuing mounting of the housing parts by screwing, into a single operation. Besides simplifying assembly, this reduces the number of parts needed by economizing on screws, press- fit sleeves, and seals.

It is thus also attainable that a printed circuit board that carries the electronic circuit comes to rest between the housing parts in such a way that it is solidly fastened in place by the welding. Advantageously, forbidden zones on the printed circuit board, which would otherwise be required for screw fastening or riveting, are also reduced.

According to the invention, the connection device is provided with a welding flange, which comes to rest between the housing parts in such a way that an at least nonpositive connection of the housing parts, with enclosure of the connection device, can be produced. Thus in a simple way, even a completely materially bonded connection at the joining edge, with enclosure of the connection device, can be produced; no complex sealing and screw geometry at the joining edge is needed. The housing parts and the welding flange are made from metal, preferably aluminum. Because of its complex shaping, the connection device has an injection-molded part, which on its outside carries the plug contacts or connecting lines for the electrical connections and which holds the welding flange by means of encompassing cast regions.

Advantageously, the welding flange is embodied such that it completely surrounds the connection device and on the outside is enclosed by the housing parts and is welded to them, so that it can be easily connected to the housing parts, again by means of laser welding.

With the invention, it is thus possible in a simple way for the two parts that must be sealed, such as the connection device and the housing of the electrical device, to be joined by both material and nonpositive bonding without using a sealant. This is important, especially in the presence of aggressive media in the surroundings of the housing, since the media resistance of such sealants is critical. The welding flange according to the invention is provided in order to produce the connection between the intrinsically unweldable material partners of plastic (for the connection device) and sheet aluminum (for the housing parts).

The embodiment of the joining edge can be improved by providing that the joining edge is formed of overlapping regions of the housing parts, and as the weld seam, an overlap seam extending between the overlapping regions is formed. Furthermore, advantageously, as the weld seam, a crimped seam extending along the outer abutting edge of the overlapping regions and the abutting edge of the welding flange at the housing regions resting on one another is formed, which assures a tight connection point.

In one embodiment, a fastening bracket can be attached to at least one of the housing parts by means of the same laser welding process, as a result of which, after the housing is mounted, it is possible to attach flexible adaptation elements oriented to a given application.

The electrical device according to the invention can be a control and/or regulating apparatus for an electromechanical component in a motor vehicle, since here the tightness of the housing and the dynamic strength are extraordinarily important.

These and other characteristics of preferred refinements of the invention will become apparent from the claims, including the dependent claims, as well as the specification and the drawings; the individual characteristics, each separately or multiply in the form of subsidiary combinations can be realized in the embodiment of the invention and in other fields and can represent versions, which are both advantageous and patentable on their own, for which patent protection is claimed here:

DRAWING

One exemplary embodiment of an electrical device with a laser-welded housing will be described in conjunction with the drawing.

DESCRIPTION OF THE EXEMPLARY EMBODIMENT

Figure 1:
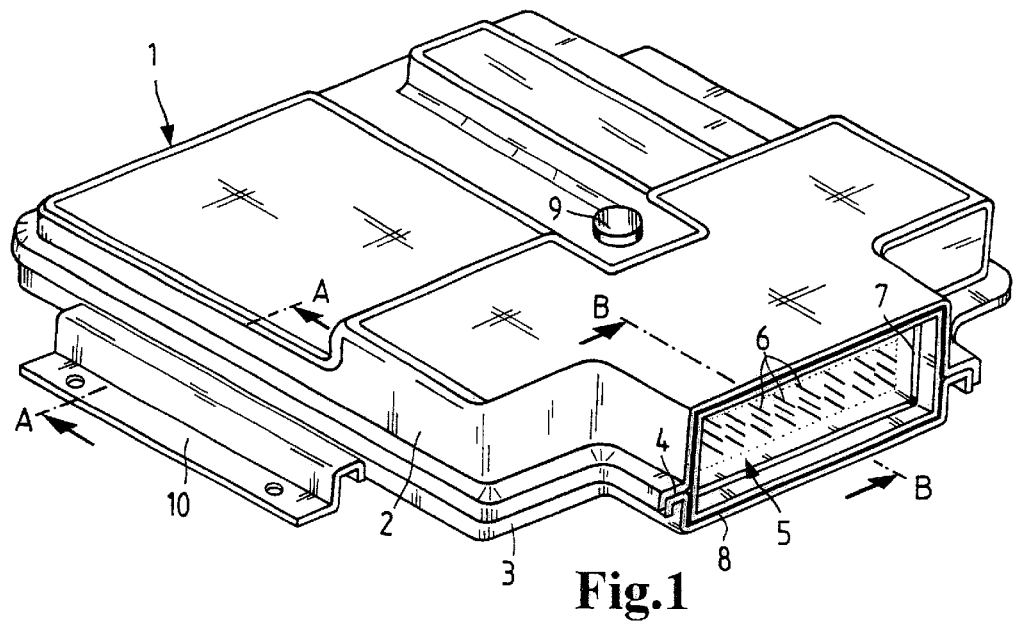
FIG. 1 shows a schematic view of a housing with an electric connection device and a fastening bracket.

In FIG. 1, an electrical device is shown with a housing 1 that has an upper housing part 2 and a lower housing part 3. The housing parts 2 and 3 of sheet aluminum contact one another at a joining edge 4 and are laser-welded there. The joining edge 4 is formed of overlapping regions of the sheet aluminum that are bent downward, but other constructions adapted to a given application are also suitable here.

In the electrical device, there is also a connection device 5 with plug contacts 6 for supplying voltage or for contacting signal lines. The plug contacts 6 are extrusion-coated in an injection-molded body 7 of the connection device 5, and the injection-molded body 7 is enclosed by a welding flange 8, also of sheet aluminum. The welding flange 8 is laser welded on the outside to the housing parts 2 and 3, as well, as will be described further below.

In the exemplary embodiment of FIG. 1, a pressure equalizing element 9 is also provided, as is needed especially for a completely tight housing 1. On the outside of the lower housing part 3, in the exemplary embodiment shown, a fastening bracket 10 is also attached, against by laser welding.

Figure 2:
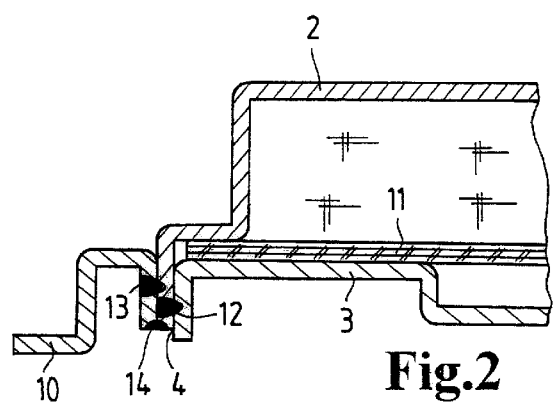
FIG. 2 is a section A—A taken through the region of the joining edge at overlapping, downward-bent housing regions and the fastening bracket.

It can be seen from a sectional view in FIG. 2 how a printed circuit board 11 can be fastened firmly in place between the upper housing part 2 and the lower housing part 3 in the laser welding operation. It can also be seen from FIG. 2 how a weld seam is applied in the form of an overlap seam 12 between the housing parts 2 and 3 and an overlap seam 13 between the upper housing part 2 and the fastening bracket 10; a weld seam 14 in the form of a crimped seam is disposed, extending all the way around the entire joining edge 4 and around the applicable contact region of the fastening bracket 10.

Figure 3:
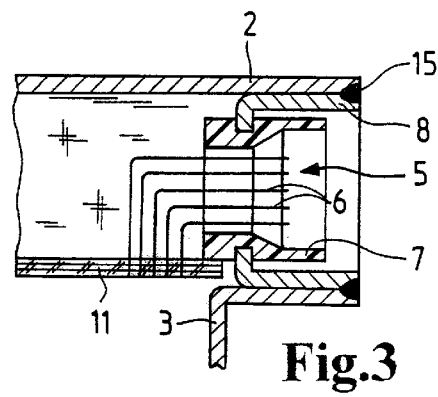
FIG. 3 shows a section B—B through the region of the housing having the connection device, which includes an injection-molded body.

In a further detailed sectional view in FIG. 3, the plastic injection-molded body 7 of the connection device 5 can be seen, into which the welding flange 8 is inserted by extrusion-coating. The welding flange 8 is joined solidly and tightly to the upper housing part 2 and the lower housing part 3 by laser welding at a crimped seam 15.

What is claimed is:

1. An electrical device, having a housing (1), comprising at least two housing parts (2, 3), and an electronic circuit that can be disposed in the housing (1), and having a connection device (5), which can be secured to the housing (1), for supplying a voltage to the device and/or signal transmission to the electronic circuit, characterized in that the housing parts (2, 3) are joined to one another by laser welding at a joining edge (4), said housing parts being connected by a weld seam;

wherein the connection device (5) has an injection-molded part with plug contacts or connecting lines, wherein the connection device (5) holds a welding flange (8) by means of encompassing cast regions, said welding flange (8) completely surrounds the connection device (5), wherein the welding flange (8) is encompassed by the last two housing parts (2, 3), said at least two housing parts (2, 3) and the welding flange (8) comprising a metal, and wherein the at least two housing parts (2, 3) and the welding flange (8) are sealingly connected to one another by means of a welding seam, wherein the housing parts (2, 3) and the welding flange (8) completely surround and enclose the connection device (5).

2. The electric device of claim 1, wherein the housing parts (2, 3) are joined to one another by a laser welding at a joining edge (4), said joining edge (4) including a completely materially bonded connection with enclosure of the connection device (5).

3. The electric device of claim 2, wherein the joining edge (4) is formed of overlapping regions of the housing parts (2, 3).

4. The electrical device of claim 3, wherein the weld seam is an overlap seam (12; 13) extending between the overlapping regions.

5. The electrical device of claim 3, wherein the weld seam is a crimped seam (14, 15) extending along the outer abutting edge of the overlapping regions and the abutting edge of the welding flange at the housing regions (2, 3) resting on one another.

6. The electrical device of claim 1, wherein a fastening bracket (10) is attached to at least one of the housing parts (3) by means of the same product by process laser welding process.

7. The electrical device of claim 1, wherein a printed circuit board (11) that carries the electronic circuit comes to rest between the housing parts (2, 3) in such a way that it is solidly fastened in place functional by the welding.

8. The electrical device of claim 1, wherein the electrical device is a control and/or regulating apparatus for an electromechanical component in a motor vehicle.

* * * * *